(12) United States Patent
Feng et al.

(10) Patent No.: US 6,914,467 B2
(45) Date of Patent: Jul. 5, 2005

(54) DUAL EDGE PROGRAMMABLE DELAY UNIT

(75) Inventors: Kai D. Feng, Essex Junction, VT (US); Hongfei Wu, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 10/729,779

(22) Filed: Dec. 4, 2003

(65) Prior Publication Data

US 2005/0122151 A1 Jun. 9, 2005

(51) Int. Cl.[7] ............................................. H03H 11/26
(52) U.S. Cl. ....................................... 327/261; 327/263
(58) Field of Search ........................ 327/161, 261–264, 327/276–278, 284, 294, 299, 565; 326/37–38, 41, 47, 86–87

(56) References Cited

U.S. PATENT DOCUMENTS

| | | | |
|---|---|---|---|
| 4,488,062 A | 12/1984 | Nakagawa et al. .......... 307/268 |
| 5,175,452 A | 12/1992 | Lupi ........................... 307/591 |
| 5,355,038 A | 10/1994 | Hui ............................. 307/603 |
| 5,572,159 A | 11/1996 | McFarland ................... 327/276 |
| 5,933,039 A | 8/1999 | Hui ............................. 327/262 |
| 5,936,451 A | 8/1999 | Phillips ....................... 327/285 |
| 6,031,401 A | 2/2000 | Dasgupta .................... 327/116 |
| 6,124,745 A | 9/2000 | Hilton ......................... 327/276 |
| 6,326,813 B2 | 12/2001 | Lindsay ........................ 326/93 |
| 6,535,057 B2 * | 3/2003 | Chakravarthy ............... 327/551 |
| 6,621,315 B2 * | 9/2003 | Heo et al. .................... 327/158 |
| 6,798,186 B2 * | 9/2004 | Korger et al. ............ 324/76.54 |
| 6,803,872 B2 * | 10/2004 | DeRyckere et al. .......... 341/160 |
| 2002/0030524 A1 | 3/2002 | Fifield ......................... 327/278 |
| 2003/0112045 A1 | 6/2003 | Atallah ........................ 327/175 |

OTHER PUBLICATIONS

"Reduced Power Delay Line Implementation" IBM TDB vol. 36 No. 12 Dec. 1993 pp. 277–279.

"Variable Shift Delay Book" IBM TDB vol. 34 No. 6 Nov. 1999 pp. 312–313.

\* cited by examiner

*Primary Examiner*—My-Trang Nu Ton
(74) *Attorney, Agent, or Firm*—William H. Steinberg (57) ABSTRACT

A method and device program a dual edge programmable delay unit, that responds to an input signal with a rise time and a fall time, includes a buffer which receives the input signal and provides an output signal with programmed variable delays between the rise and fall times of the output signal. Programmable control sources (PCS) provide separate control inputs to a buffer. The FTPCS charges a capacitor in the buffer when the input signal changes from high to low to adjust time delay before the fall of the buffer output signal. The RTPCS discharges the capacitor in the buffer when the input signal changes from low to high to adjust time delay before the rise of the buffer output signal.

20 Claims, 7 Drawing Sheets

FIG. 2G too long dent rising edge and falling edge delay time settings. The programmable delay unit of this invention can be used as real time, on-chip timing adjustment unit in a high speed system.

Further in accordance with this invention, a method and device are provided for programming of a dual edge programmable delay unit a programmable delay unit in response to an input signal. A buffer control circuit is included which receives an input signal with a rise time and a fall time and provides an output signal with variable delays between the rise and fall times of the output signal as programmed to programmable control sources (PCS) providing a separate control inputs to first and RTPCS. The FTPCS provides a first output current which charges a capacitor in the buffer and the RTPCS provides a second output current which discharges the capacitor in the buffer circuit. Variable control signals are provided to the PCS. The FTPCS provides an output current through the buffer circuit when the input signal transits from logic high to logic low and the RTPCS provides an output current through the buffer circuit when the input signal transits from logic low to logic high. The buffer control circuit responds to the output current through the FTPCS when the input signal transits from logic high to logic low or responds the output current through the RTPCS when the input signal transits from logic low to logic high.

Preferably there are two separate controlled programmable current sources on the P side and the N side. The P side programmable source sets the charge current to the gate capacitance so that it can control the delay time at the falling edge (when the input signal VA changes from logic high to logic low). The N side programmable source sets the discharge current from the gate capacitance so that it can control the delay time at the rising edge (when the input signal VA changes from logic low to logic high). Therefore the two delay times can be adjusted independently. Since the dual edge delay times can be programmable separately, the delay unit can set different delay times for the rising edge and the falling edge, which is a feature that is especially useful in adjusting the timing of integrated circuits.

Preferably, the programmable current source consists of a pair of switching current mirrors or switching current sources that can be turned ON or turn OFF very fast on the order of picoseconds (ps). There is a code protection circuit in the delay unit, which restricts the P side current source to changing the current setting code only during the time that the input signal VA at logic high. The code protection circuit in the delay unit also restricts the N side current source to changing the current setting code only when the input signal VA is at logic low. Thus all delay times are predictable, because no delay time between two settings would occur. Due to the improved performance of the dual edge programmable delay unit, it can be used for real time and on-chip timing adjustment in integrated circuits to reach glitch free status.

A buffer circuit is provided which includes a pair of inverters. The second inverter is a Schmitt trigger circuit which has a fast rising time and a fast falling time due to positive feedback.

Preferably, the buffer control circuit includes a first inverter and a second inverter. A buffer control circuit is provided including a first inverter and a second inverter each having an input and an output with the first having a first input and a first output and the second inverter having a second input and a second output. The first inverter to responds to the FTPCS when the input signal transits from logic high to logic low to connect between the FTPCS and the first output. Provide for the first inverter to respond to the RTPCS when the input signal transits from logic low to logic high to connect between the RTPCS and the first output. Connect the first output of the first inverter to a node connected to the second input of the second inverter with the second inverter providing the output signal at the second output, from the second inverter. Connect a capacitor between the node and a reference potential. Provide a Schmitt trigger circuit as the second inverter. Provide current mirror circuits in the FTPCS and the RTPCS. Provide a first control word to a first latch which in turn provides a first variable control signal to the FTPCS. Provide a second control word to a second latch which in turn provides a second variable control signal to the RTPCS. Provide FET fingers in the FTPCS with each finger thereof being controlled by an output from a register in the first latch. Provide FET fingers in the RTPCS with each finger thereof being controlled by an output from a register in a corresponding latch.

In accordance with another aspect of this invention, provide dual edge programming using a programmable delay unit with a buffer control circuit including a signal input, a signal output, a PSPC connection line, and a NSPC connection line. Provide a P Side Programmable Current (PSPC) source with a PSPC input and a PSPC current line connected to the buffer through the PSPC connection line. Provide an N side (NS) latch that is adapted to receive an input of an N side control word and a N side write signal and outputs of N side switching signals, which are a function of the N side control word. The NS latch provides outputs of N side switching signals that are a function of the N side control word, with outputs of the N side switching signals being provided to the input of the PSPC source. Provide an N Side Programmable Current (NSPC) source having an NSPC source input and an NSPC current line connected to the buffer through the NSPC connection line. Provide a P side (PS) latch adapted to receive an input of an P side control word and a P side write signal and outputs of P side switching signals, which are a function of the P side control word. The PS latch provides outputs of P side switching signals which are a function of the P side control word with the outputs of the N side switching signals being provided to the input of the PSPC source.

The buffer control circuit includes a first inverter and a second inverter. Provide the buffer control circuit with a first inverter and a second inverter each having an input and an output with the first having a first input and a first output and the second inverter having a second input and a second output. Provide for the first inverter to respond to the first PSPC source when the input signal transits from logic high to logic low to connect between the first PSPC source and the first output. Provide for the first inverter to respond to the second PSPC source when the input signal transits from logic low to logic high to connect between the second PSPC source and the first output. Connect the first output of the first inverter to a node connected to the second input of the second inverter.

The second inverter provides the output signal at the second output, from the second inverter. Provide a PMOS FET and an NMOS FET in the first inverter having first ends of source drain circuits thereof connected to the output of the first inverter. Connect the input to the first inverter to gate electrodes of the PMOS FET and the NMOS FET. Connect opposite ends of the source drain circuits of the PMOS FET and the NMOS FET to outputs of the first PSPC source and the second PSPC source.

In accordance with still another aspect of this invention, a dual edge programmable delay unit responsive to an input signal is provided. A buffer control circuit receives an input signal with a rise time and a fall time, the buffer control circuit providing an output signal with variable delays between rise and fall times of the output signal as a function of programming provided to first and second programmable control sources (PCS). A first control input to the FFPCS and a separate, a second control input to a RTPCS. Each of the FTPCS being programmable to provide a first variable output current. Each of the RTPCS being programmable to provide a second variable output current. A first variable control signal to the FTPCS and a second variable control signal to the RTPCS.

The buffer control circuit responds (a) when the output current through the FTPCS the input signal transits from logic high to logic low, or (b) when the output current through the RTPCS when the input signal transits from logic low to logic high. The FTPCS is adapted to provide output current to the buffer circuit when the input signal transits from logic high to logic low. The RTPCS is adapted to provide output current to the buffer circuit when the input signal transits from logic low to logic high.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
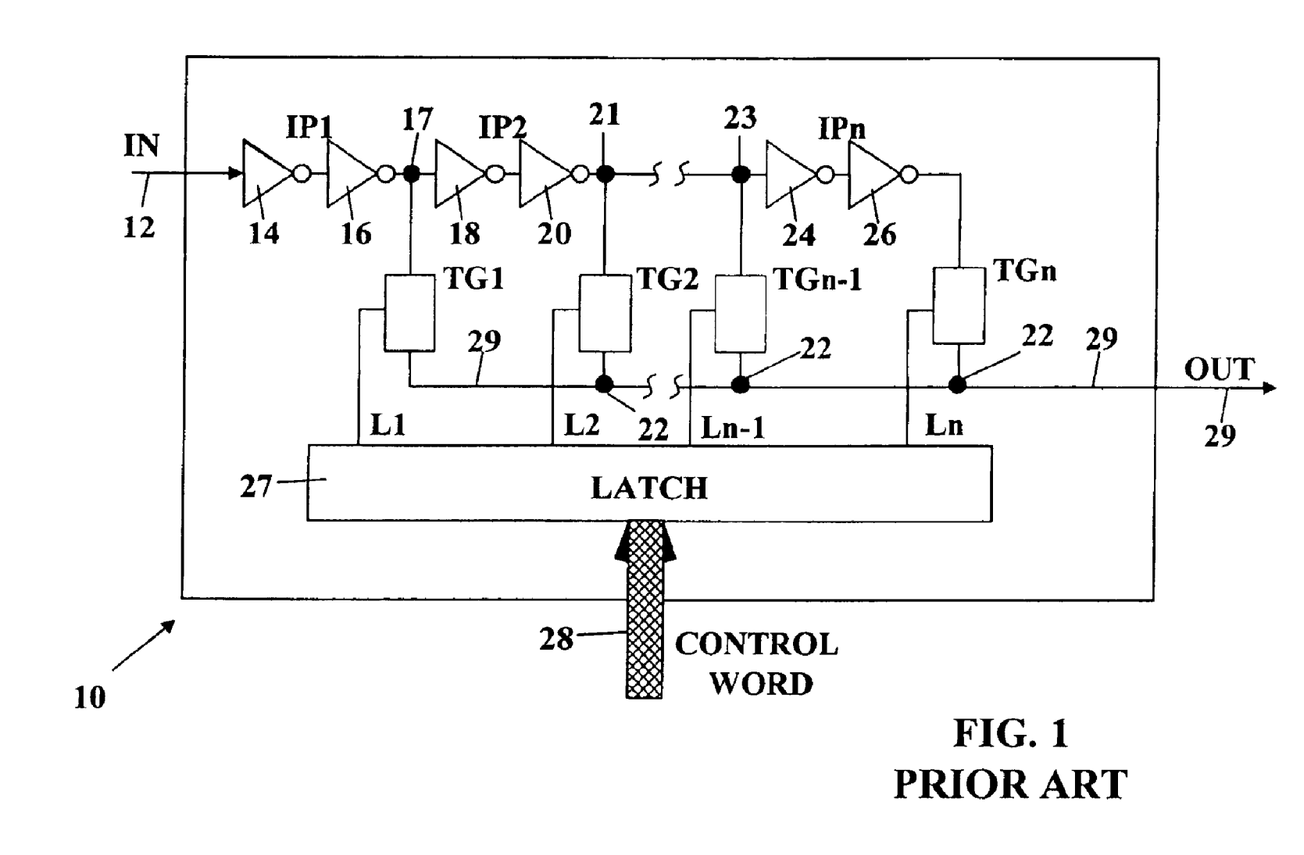
FIG. 1 shows a schematic circuit diagram of a conventional prior art programmable delay unit.
Figure 2A:
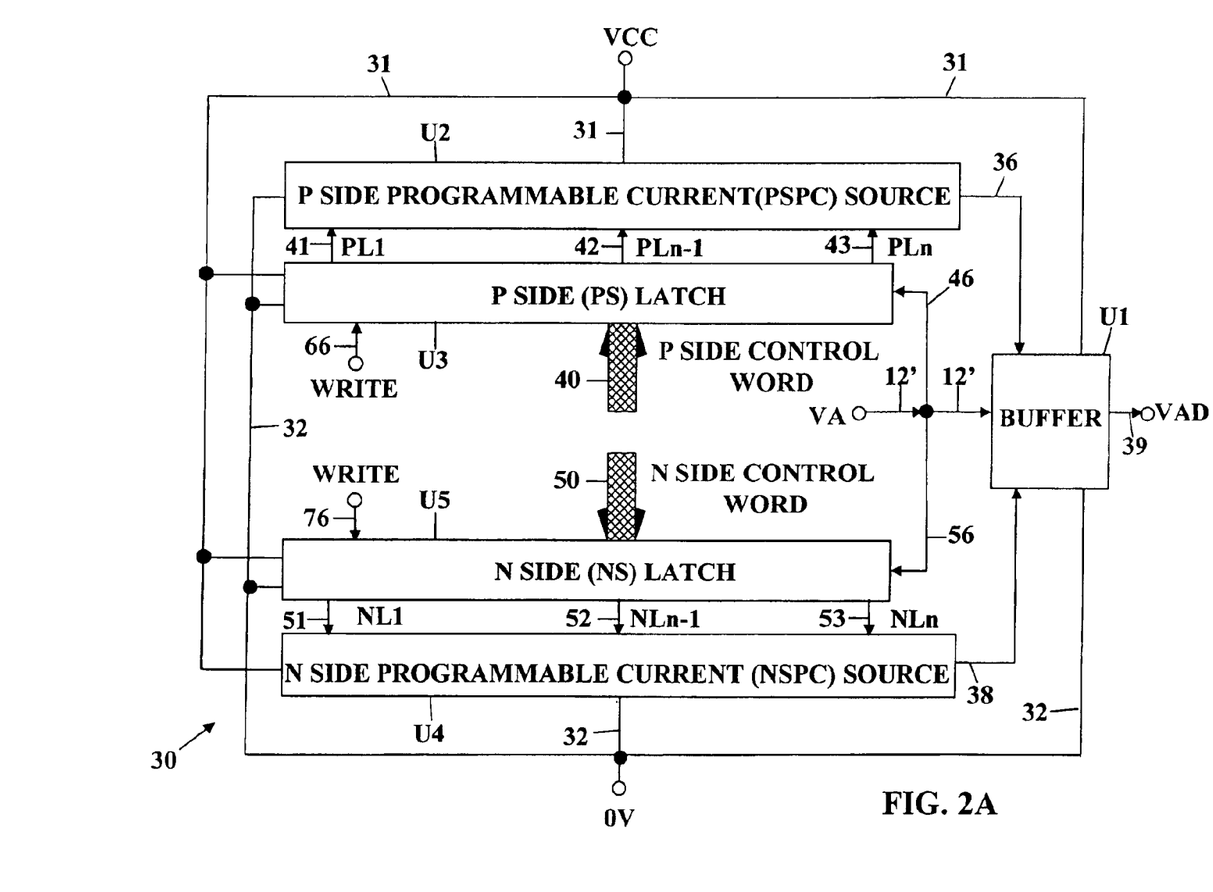
FIG. 2A is a schematic block diagram of a programmable delay unit in accordance with this invention which can adjust the rising edge delay time and falling edge delay time independently from input signal VA to output signal VAD.

FIG. 2A is a schematic block diagram of a programmable delay unit 30 in accordance with this invention, which can independently adjust both the rising edge delay time and the falling edge delay time of an output signal VAD which is produced in response to an input signal VA.

The programmable delay unit 30 shown in FIG. 2A consists of five sub-circuits. A first one of those circuits is a buffer circuit U1, which receives the input signal VA and produces the output signal VAD. The programmable delay unit 30 also includes a P side Programmable Current (PSPC) source U2, a P Side (PS) Latch U3, an N side Programmable Current (NSPC) source U4, and an N Side (NS).

The latch U3 provides digital signals to the PSPC source U2 to control the adjustment of the falling edge delay time of the output signal VAD relative to the falling edge time of the input signal VA in response to a digital input from P Side Control Word input bus 40 under control of a computer control system (not shown). In turn, the PSPC source U2 generates a current supplied on line 36 to the buffer circuit U1 the variable amplitude of which controls the falling edge delay time of the output signal VAD in response to digital falling edge delay control signals from the PS latch U3.

The latch U5 provides digital signals to the NSPC source U4 to control the adjustment of the rising edge delay time of the output signal VAD relative to the rising edge time of the input signal VA in response to a digital input from the N Side Control Word input bus 50 under control of a computer control system (not shown). In turn, the NSPC source U4 generates a current supplied on the line 38 to the buffer circuit U1 the variable amplitude of which controls the rising edge delay time of the output signal VAD in response to rising edge delay control signals from the NS latch U5.

Thus, the falling edge delay time and the rising edge delay time of the output signal VAD relative to the falling edge and rising edge time of the input signal VA are controlled independently.

A power supply with voltage VCC (positive voltage) is connected to all sub-circuits including buffer U1, PSPC source U2, PS latch U3, NSPC source U4 and NS latch U5 by line 31 via connected nodes. The ground or reference potential (0V) of the power supply is connected to all sub-circuits including buffer U1, PSPC source U2, PS latch U3, NSPC source U4, and NS latch U5 by line 32 via connected nodes.

The P side control word is supplied as a digital signal on the bus line 40 to the PS latch U3 and a write signal is supplied thereto on the line 66. The P side control word on bus line 40 and the write signal on line 66 are supplied to the PS latch U3 by the system controller (not shown) which may be a microprocessor, a phase detector, a microcontroller, or a glitch detector, as will be well understood by those skilled in the art.

The PS latch U3 supplies a set of digital switching signals PL1, . . . , PLn-1, PLn on lines 41, 42, 43 to the PSPC source U2, which is connected by the U2 to U1 buffer input line 36 to supply an analog current to the buffer U1. The analog current passing through the U2 to U1 buffer input line 36 varies as a function of the P side control word on line 40, as registered by P side latch U3.

An N side control word is supplied as a digital signal on bus line 50 to NS latch U5 and a write signal is supplied thereto on line 76. The N side control word on bus line 50 and the write signal on line 76 are supplied by the system controller (not shown) which may be a microprocessor, a phase detector, a microcontroller, or a glitch detector, as will be well understood by those skilled in the art.

The NS latch U5 supplies a set of digital switching signals NL1, . . . , NLn-1, NLn on lines 51, 52, 53 to the NSPC source U4, which is connected by line 38 to supply an analog current to the buffer U1. The analog current passing through line 38 varies as a function of the N side control word on line 50, as registered by the N side latch U5.

The input signal VA is connected through line 12' to the buffer U1, and from line 12' to line 46 to the PS latch U3 and from line 12' to line 56 to the NS latch U5. Buffer U1 supplies the output signal VAD on line 39.

1. The Buffer Circuit

Figure 2B:
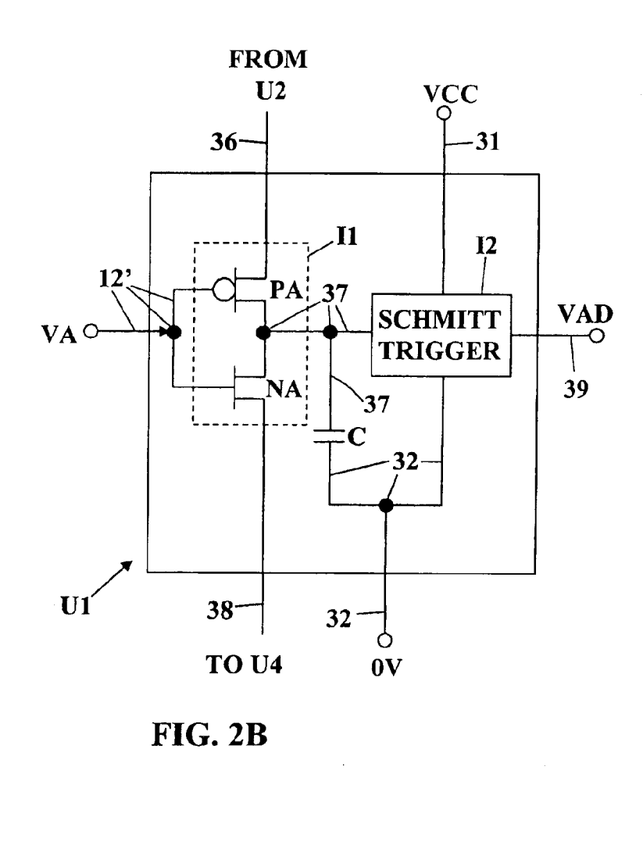
FIG. 2B is a schematic diagram of the buffer circuit shown in FIG. 2A consisting of two inverters and a capacitor.

Referring to FIG. 2B, the buffer circuit U1 consists of two inverters I1 and I2 plus a capacitor C. The first inverter I1 has its input connected to receive the input signal VA on line 12' and to provide its output at a node 37. Line 36 from PSPC source U2 and line 38 from NSPC source 38 connect to the first inverter I1.

One terminal of the capacitor C is connected to both the output of the first inverter I1 and the input of the second inverter I2 through the nodes/line 37. The other terminal of the capacitor C is connected via nodes/line 32 to the reference potential (0V).

Figure 2C:
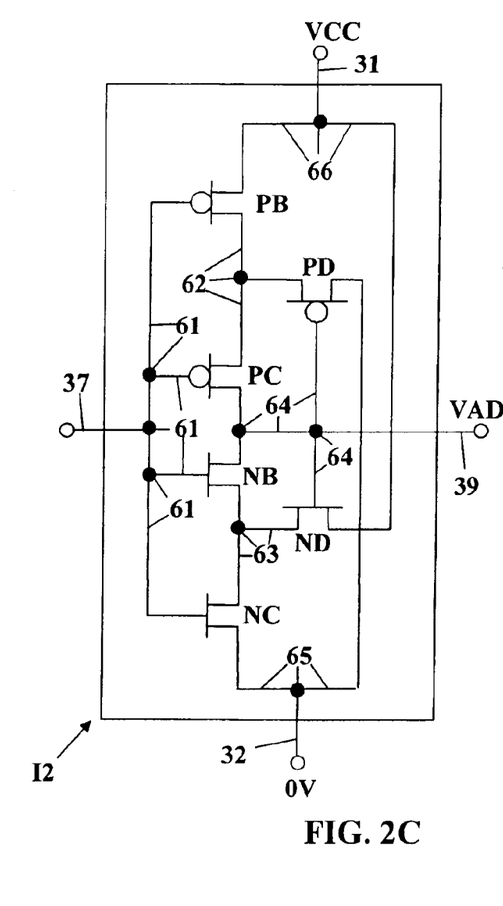
FIG. 2C shows a Schmitt trigger circuit which is the second inverter of the buffer circuit FIG. 2B.

The second inverter I2, shown in detail in FIG. 2C, is a Schmitt trigger circuit which has its input connected to nodellines 37 and its output connected to output line 39 to provide the output signal VAD. In addition, the second inverter I2 is connected by line 31 to power supply voltage VCC and to reference potential (0V) via line 32.

Referring to FIG. 2B, the first inverter I1 includes a CMOS pair of FET devices comprising the PFET PA and the NFET NA with their source/drain circuits connected in series with their drains connected together at node 37. The source terminal of the PFET PA is connected via line 36 to the PSPC source U2. The source terminal of the NFET NA is connected via line 38 to the NSPC source U4.

When the input signal VA on line 12' transits from logic high to logic low, in the inverter I1 the PFET PA is turned ON and NFET NA is turned OFF. When the PFET PA is turned ON, analog current flows from line 36. The analog current flowing through line 36, which varies as a function of the P side digital control word on bus line 40, flows through the source/drain circuit of the PFET PA into the node 37 to charge the input capacitance C relative to the reference potential. In other words, the current that charges the capacitor C or the input capacitance of the second inverter I2 is the source current flowing through line 36, which (as stated above) is connected to the PSPC source U2, shown in FIG. 2D.

If the charging current is large, the voltage on the node 37 across the capacitance C increases rapidly, the output of the second inverter I2 is changed from logic high to logic low early. Thus the delay time of the falling edge of output signal VAD is short. On the other hand, if the charging current is small, the voltage on node 37 across the capacitance C increases slowly, and the output VAD of the second inverter I2 is changed from logic high to logic low late. Thus the delay time of the falling edge of output signal VAD is long.

When the input signal VA transits from logic low to logic high, in the inverter I1, the PFET PA is turned OFF and NFET NA is turned on. When NFET NA is turned on, analog current flows from the capacitor C through node 37 and line 38 between buffer U1 and the NSPC U4. The analog current, which varies as a function of the digital N side control word on bus line 50, discharges the input capacitance C at the input of the second inverter I2 as a result of the analog sink current flowing through line 38, which (as stated above) is connected to the NSPC source U4, shown in FIG. 2F.

If the discharging current is large, the voltage on the capacitance C decreases rapidly, the output VAD of the second inverter I2 is changed from logic low to logic high early, and the delay time of the rising edge of the output signal VAD is short. If the discharging current is small, the voltage on the capacitance C decreases slowly, the output of the second inverter I2 changes from logic low to logic high late, the delay time of the rising edge of output signal VAD is long.

The input capacitance C to the second inverter I2 may be a separate capacitor C, as shown in FIG. 2B. Alternatively, the input capacitance C may comprise the parasitic capacitance of the output circuit of the first inverter I1 and the input circuit of the second inverter I2.

It is obvious that the PSPC source U2 determines the falling edge delay time and the NSPC source U4 determines the rising edge delay time. Since there is separate control of the PSPC source U2 and the NSPC source U4, as described above, the falling edge delay time and the rising edge delay time can be set independently.

FIG. 2C shows the details of a preferred embodiment of the schematic circuit diagram of the second inverter I2 including PMOS FET devices PB, PC and PD and NMOS FET devices NB, NC and ND connected in a Schmitt trigger configuration. The second inverter I2 can decrease the rising time and falling time of the inverter output signal VAD because of the positive feedback. The nodes/lines 37 serve as the input to the second inverter I2 connecting through nodes/lines 61 to the gates of PMOS FETs PB and PC and the gates of NMOS FETs NB and NC.

The power supply voltage VCC is connected through line 31 to the node/lines 66 thereby connecting to the source of PMOS FET PB and the drain of NMOS FET ND. The reference potential 0V is connected through line 32 to node and line 65, which connects to the source of NMOS FET NC and the drain of PMOS FET PD.

The source/drain circuits of PMOS FETs PB and PC and NMOS FETs NB and NC are connected in series in that order between node 66 (VCC) and node 65 (0V). The drain of PMOS FETs PB is connected through node and lines 62 to the sources of PMOS FETs PD and PC. The drain of NMOS FETs NC is connected through node and lines 63 to the sources of NMOS FETs NB and ND. The drains of PMOS FET PC and NMOS FET NB are connected through nodes and lines 64 and the output line 39 to the terminal for the output signal VAD and the gates of PMOS FET PD and NMOS FET ND.

2. P Side Programmable Current (PSPC) Source U2

Figure 2D:
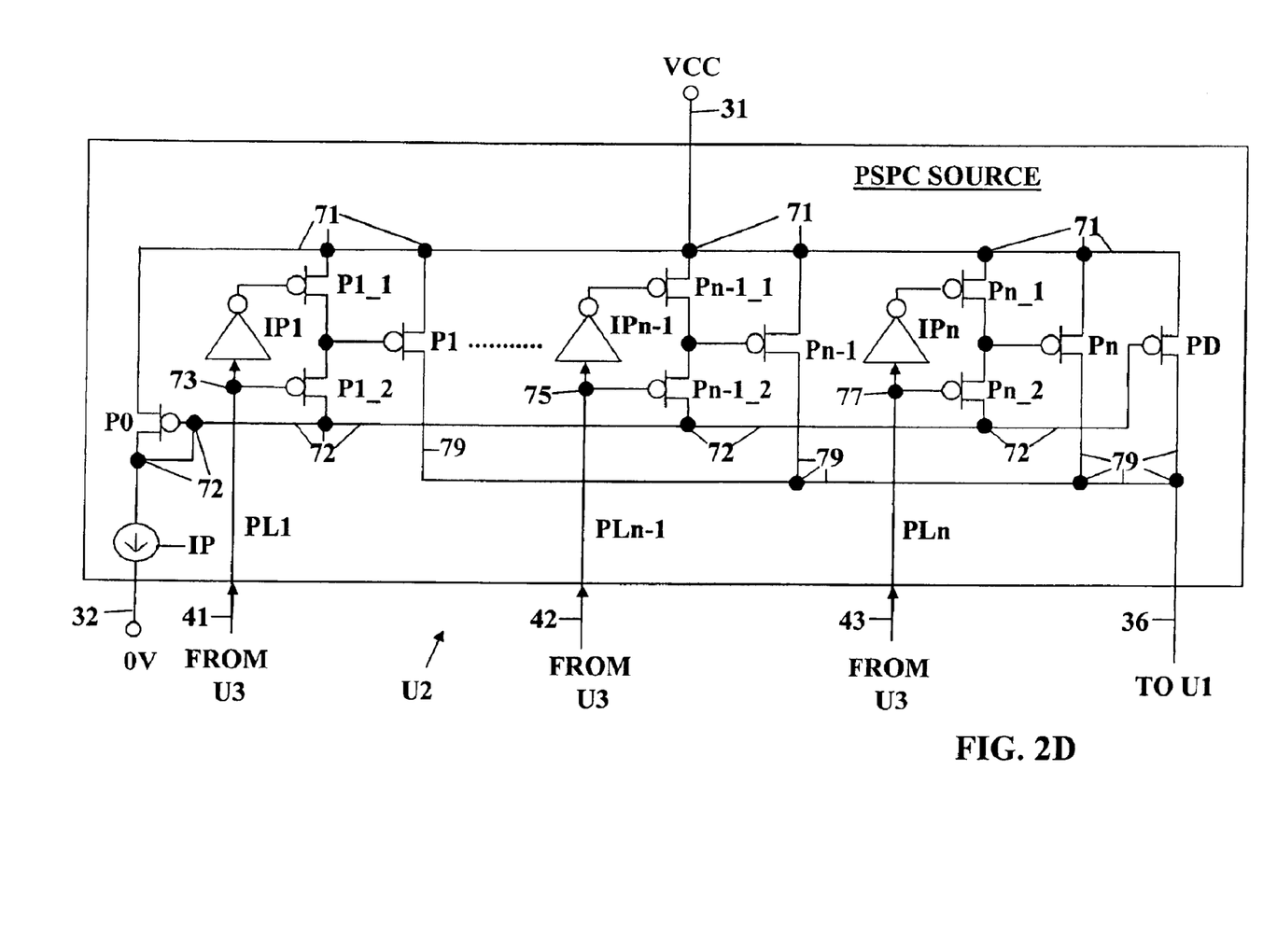
FIG. 2D shows the P side programmable current source of FIG. 2A, which is a P type current mirror.

FIG. 2D is a schematic circuit diagram of PSPC source U2 of FIG. 2A, which is a P type current mirror that converts a digital input signal on lines 41–43 from PS latch U3 to an analog current through output line 36. The primary part of the current mirror includes a fixed current source IP and the initial PMOS FET P0 which provide a current to be mirrored. The source of PMOS FET P0 is connected via lines/nodes 71 to line 31 to power supply voltage VCC. The drain and gate of PMOS FET P0 are interconnected to node/lines 72 and the upper end of fixed current source IP. The lower end of fixed current source IP is connected through line 32 to the reference potential (0V) terminal of the power supply.

The secondary part of the P type current mirror comprises a set of PMOS FET fingers P1, . . . , Pn–1, Pn comprising programmable current sources that are switched by switch circuits connected to receive the respective digital switching signals PL1, . . . , PLn–1, PN on lines 41, 42, 43 from the PS latch U3, plus the default PFET PD. The PMOS FET P0, the switched PMOS FETs P1, . . . Pn–1, Pn, and the PMOS default FET PD have the same channel length, but they all have different channel widths. The analog current through each of the fingers P1, . . . , Pn–1, Pn is the product of the current through the fixed current source IP and the ratio of the channel width of the PMOS FET in that particular finger over the channel width of the PMOS FET P0.

The switch circuits comprise a set of inverters IP1, . . . IPn–1, IPn, and corresponding series connected pairs of the PMOS FETs P1__1, P1__2, . . . , Pn–1__1, Pn–1__2, Pn__1, and Pn__2 turn ON or turn OFF each of the fingers P1, . . . Pn–1, Pn in response to the signals PL1, PLn–1 and PLn on lines 41, 42, 43. The PMOS FETs P1__1 and P1__2; PFETs Pn–1__1 and PFETs Pn–1__2; and Pn__1, and Pn__2 are connected as series pairs with their source/drain circuits connected in series. The sources of upper PMOS FETs P1_1, Pn-1_1, and Pn_1, are connected to power supply VCC via lines/nodes 71 and line 31. The drains of PFETs P1_2, Pn-1_2, and Pn_2 are connected via lines/nodes 72 to the gate of PMOS FET P0 and the upper end of current source IP. The drains of PMOS FETs P1, Pn-1, Pn are connected via lines/nodes 79 and the output line 36 to buffer U1.

First input PL1 on line 41 from P side latch U3 connects to node 73 of the first switch circuit that connects to the gate of PMOS FET P1_2 and input of the inverter IP1 that provides an output to the gate of PMOS FET P1_1. The n-1$^{th}$ input PLn-1 on line 42 from PS latch U3 connects to node 75 of the n-1$^{th}$ switch circuit that connects to the gate of PMOS FET Pn-1_2 and input of the inverter IPn-1 that provides an output to the gate of PMOS FET Pn-1_1. The n$^{th}$ input PLn on line 43 from PS latch U3 connects to node 77 of the n$^{th}$ switch circuit that connects to the gate of PMOS FET Pn_2 and input of the inverter IPn that provides an output to the gate of PMOS FET Pn_1.

For example, when control signal on PL1 line 41 from the PS latch U3 is at its logic low, in the first switch circuit the PMOS FET P1_1 is turned OFF, and PMOS FET P1_2 is turned ON causing the PMOS FET P1 to be turned ON so that the mirrored current through PMOS FET P1 is ON allowing current to flow from the voltage source VCC through line 31, node 71, the source/drain of finger P1 and node 79 to provide an output flow of current through line 36 to the buffer U1. On the other hand, when the control signal on PL1 line 41 is at its logic high, PMOS FET P1_1 is turned ON, PMOS FET P1_2 is turned OFF, so PMOS FET P1 is turned OFF, so no mirrored current sources (i.e. flows) through the source/drain circuit of finger P1 through line 79 and line 36 to the buffer U1.

PMOS FET PD is a default finger without any connection of a switch circuit to the gate electrode thereof. The PMOS FET PD always provides a charge current when the PMOS FET PA of the buffer U1 is turned ON, so that when all programmable fingers are turned OFF, the PMOS FET PD still provides a charge current via line/node 79 through line 36 to the buffer U1. All inverters (IP1, . . . , IPn-1, IPn) are powered by the power supply VCC and 0V.

3. P Side (PS) Latch U3

Figure 2E:
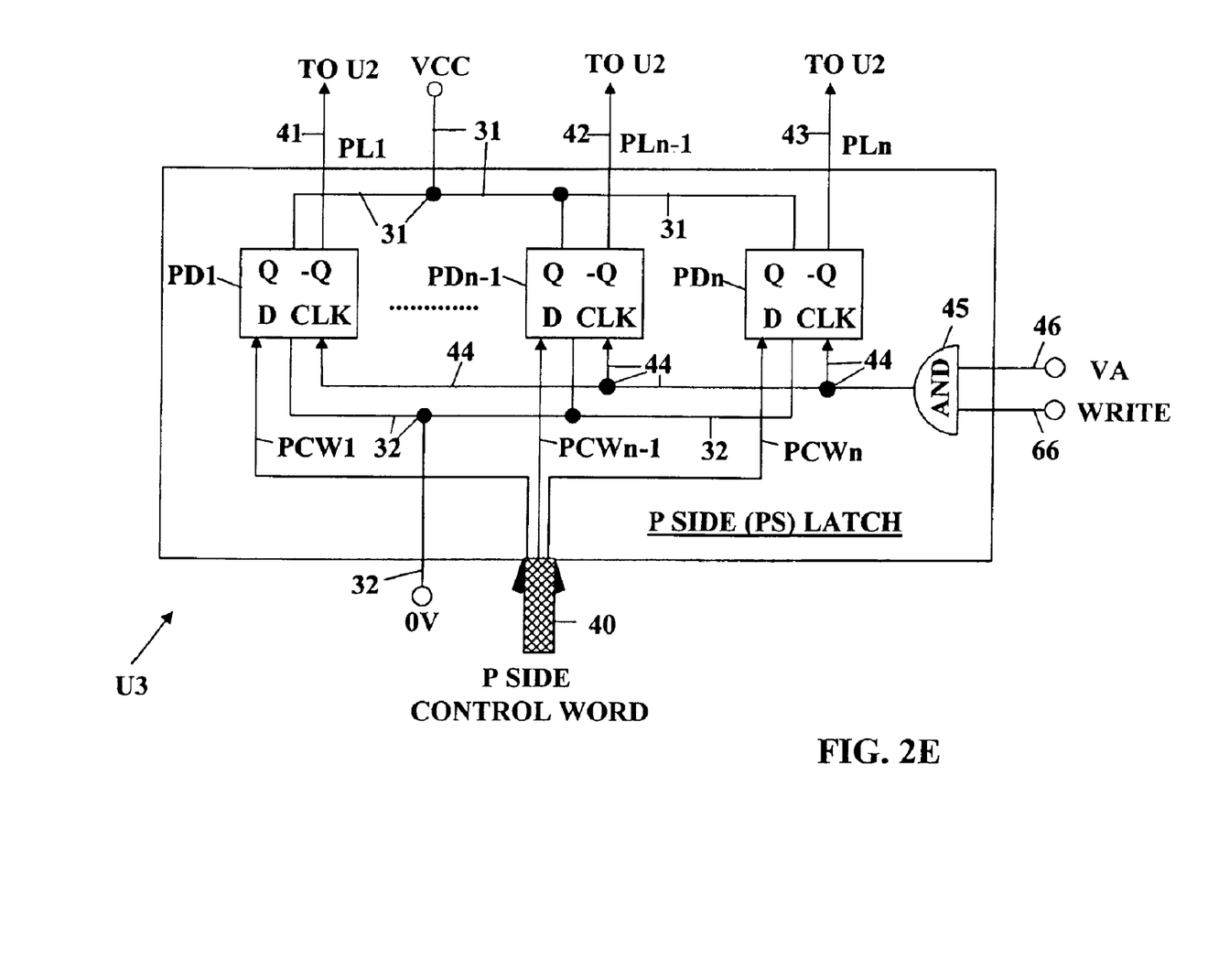
FIG. 2E shows the P side latch of FIG. 2A which consists of a set of "n" D type registers plus an AND gate.

FIG. 2E is a schematic, circuit diagram of the PS latch U3 of FIG. 2A. PS latch U3 consists of a set of "n" D type registers PD1, . . . , PDn-1, PDn. A D type register or a D register is a very popular unit in digital circuits. Such a register has two inputs: D and CLK. When a pulse is applied to the CLK input, the logic status on input D is read to the register output Q. The data terminals of the D type registers are connected to individual lines PCW1, . . . PCWn-1, PCDWn in bus line 40 that connect bits of the P side control word to individual ones of the registers PD1, . . . , PDn-1, PDn. The complement outputs Q of the registers PD1, . . . , PDn-1, PDn provide the digital control signals PL1, . . . , PLn-1, PLn on lines 41–43 to the P side PSPC source U2.

When the P side control word on bus lines 40 is written by a write signal on line 66, (connected through AND 45 to the node that connects through lines/nodes 44 to the CLK input of the registers PD1, . . . , PDn-1, PDn by the signal of "write" on line 66) the logic status of the control signals of fingers P1, Pn-1, Pn could be changed. For example, when the bit on line PCW1 is logic high and written to the register PD1, PL1 line 41 is at a logic low which turns ON the finger P1 of P side PSPC source U2. However, when the bit on line PCW1 is logic low and written to the register PD1, PL1 line 41 is at logic high, which turns OFF the finger P1 of the PSPC source U2.

The AND gate 45 is important because it provides protection, that only when the input signal VA on line 46 to AND 45 is at a logic high (because the PMOS FET PA of the first inverter I1 of buffer U1 is turned OFF) the "write" signal on line 66 is allowed to write a new status of the P side control word to the registers PD1, . . . , PDn-1, PDn to change the logic statuses of the fingers P1, . . . Pn-1, Pn.

The protection function guarantees that the timing of the delay time of each falling edge of the input pulse of input signal VA is predictable and controllable. This function makes the delay unit qualified to adjust the timing of a high speed system both on line and in real time.

All D type registers (PD1, . . . PDn-1, PDn) and AND gate 45 are powered by the power supply VCC and 0V. (please delete the connections 31 and 32 on the D type registers).

4. N Side Programmable Current (NSPC) Source U4

Figure 2F:
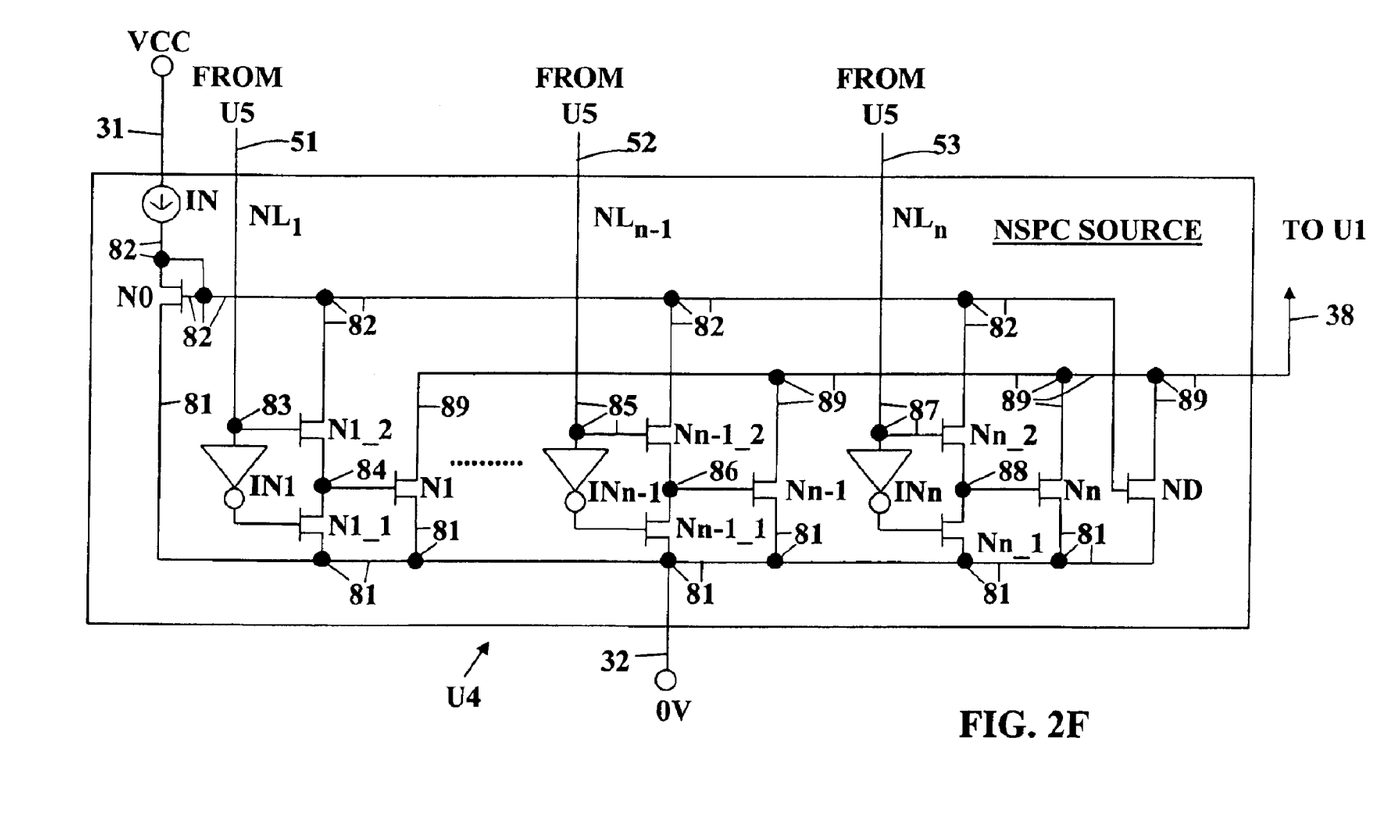
FIG. 2F shows the N side programmable current source of FIG. 2A, which is an N type current mirror.

FIG. 2F is a schematic circuit diagram of NSPC source U4 of FIG. 2A, which is an N type current mirror that converts a digital input signal on lines 51–53 from PS latch U5 to an analog current through output line 38. The primary part of the current mirror includes a fixed current source IN and the initial NMOS FET N0 that provide a current to be mirrored. The source of NMOS FET P0 is connected via lines/nodes 81 to line 32 to reference potential (0V). The drain and gate of NMOS FET N0 are interconnected to node/lines 82 and the lower end of fixed current source IN. The upper end of fixed current source IN is connected through line 31 to the terminal of the power supply voltage VCC.

The NSPC source U4, shown in FIG. 2F is an N type current mirror. Primary parts of the current mirror are fixed current source IN and PMOS FET N0. Secondary parts of current mirror U4 are a set of switched NMOS FET fingers N1, . . . Nn-1, Nn plus the default NMOS FET ND. The NFETs N0, N1, . . . Nn-1, Nn, ND have the same channel length, but different channel widths, the current through each finger is the product of the current through the fixed current source IN and the ratio of the channel width of the NMOS FET in that particular finger over the channel width of the PMOS FET N0.

The inverters of IN1, . . . INn-1, INn, NMOS FETs N1_1, N1_2, . . . Nn-1_1, Nn-1_2, Nn_1, Nn_2 are used to turn each of the fingers ON or OFF. For example, when the control signal on NL1 line 51 from the NS latch U5 is at logic high, NMOS FET N1_1 is turned OFF, NMOS FET N1_2 is turned ON so that NMOS FET N1 is turned on, the mirrored current through NMOS FET N1 is ON. When the control signal on NL1 line 51 is at logic low, NMOS FETs N1_1 is turned ON, NMOS FET N1_2 is turned OFF, NMOS FET N1 is turned OFF, so no mirrored current sources (i.e. flows) from the finger N1 through the source/drain of the fingers of the NSPC source U4 and through lines 79 and 38 to buffer U1.

The NMOS FET ND is a default finger without the switch circuits in the gate, The NMOS FET ND always provides discharge current when the NMOS FET NA of the buffer U1 is turned ON, so that when all programmable fingers are turned OFF, the NMOS FET ND still provides the discharge current. All of the inverters (IN1, . . . INn-1, INn) are powered by connection across the power supply VCC and reference potential (0V).

5. N Side (NS) Latch U5

Figure 2G:
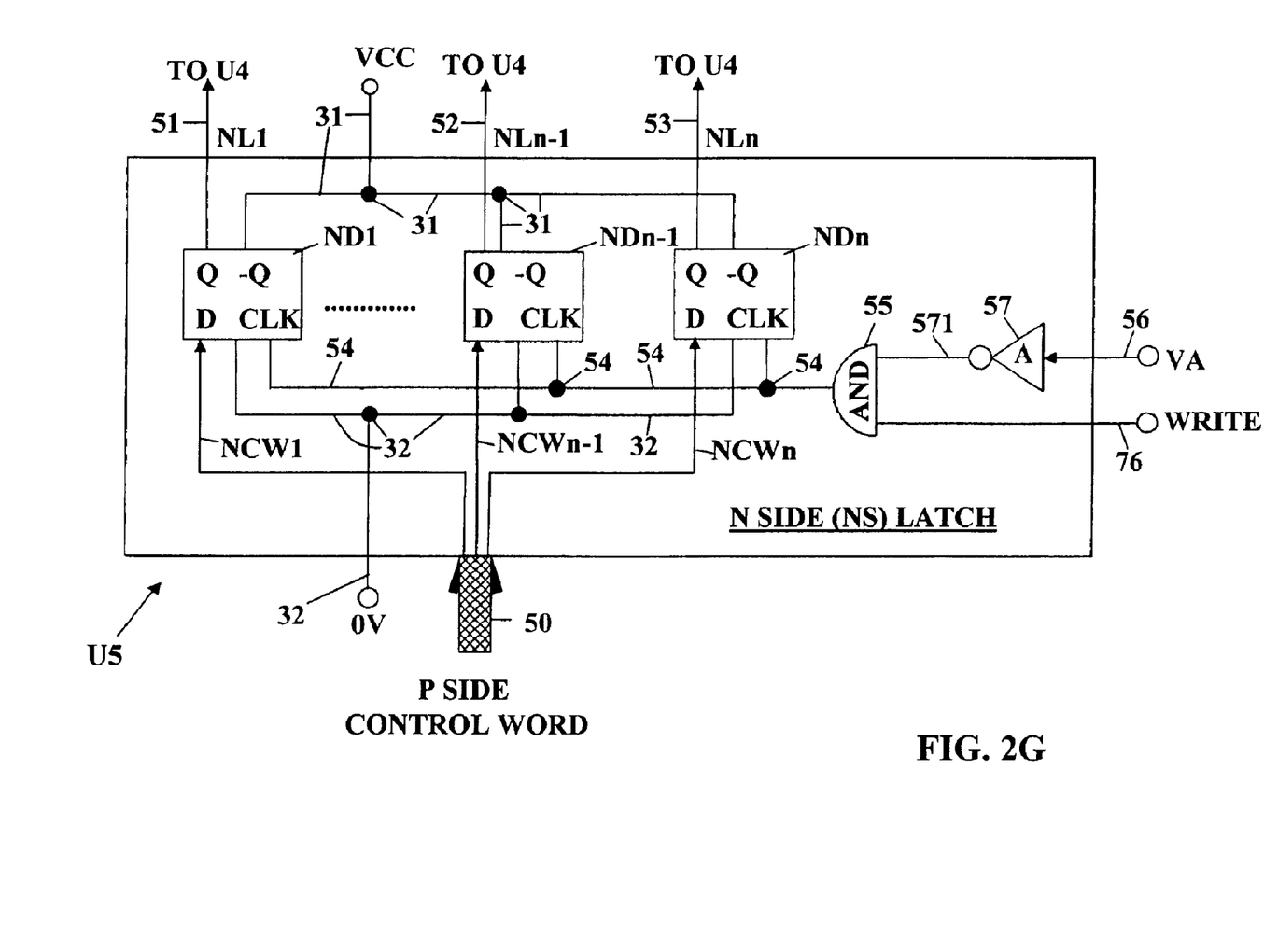
FIG. 2G shows the N side latch of FIG. 2A which consists of a set of "n" D type registers plus an inverter and an AND gate.

The NS latch U5 shown in FIG. 2G consists of a set of D type registers ND1, . . . NDn-1, NDn, wherein the data terminals of the registers are connected to bits of the N side control word, NCW1, . . . NCWn−1, NCDWn. The outputs of the registers ND1, . . . NDn−1, NDn provide the digital control signals NL1, . . . , NLn−1, NLn on lines 51–53 to the NSPC source U4. When the control word on bus lines 50 is written to the registers ND1, . . . NDn−1, NDn by the signal of "write" on line 76 transmitted through AND 55 to node and lines 54 which are connected to the CLK inputs of the registers ND1, . . . NDn−1, NDn, the logic status of the control signals of registers NL1, NLn−1, NLn could be changed.

For example, when the control word bit on line NCWL from P side control bus line 50 is logic high and written to the register ND1, control signal on NL1 line 51 is at logic high which turns ON the finger N1 of NSPC source U4, when the bit of NCW1 is logic low and written to the register ND1, NL1 is at logic low which turns OFF the finger N1 of NSPC source U4.

The combination of the inverter 57 and the AND gate 55 provides an important protection, only when the input signal VA is at logic low, the NMOS FET NA of buffer U1 is turned OFF, the signal "write" is allowed to write a new status of N side control word to the registers ND1, . . . NDn−1, NDn to change the logic statuses on lines NL1, . . . NLn−1, NLn.

The protection function guarantees the delay time of each rising edge of the input pulse of input signal VA is predictable and controllable. This function makes the delay unit qualified to adjust the timing of high speed system on line and in real time.

All of the D type registers (ND1, . . . NDn−1, NDn), the AND gate 55 and the inverter 57 are powered by the power supply VCC and reference potential (0V).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of providing programming of dual edge programmable delay unit comprising:
   providing a buffer circuit which is adapted to receive a buffer input signal, with said buffer input signal falling at an input signal fall time and said buffer input signal rising at an input signal rise time;
   said buffer circuit providing a falling buffer output signal at an output signal fall time and a rising buffer output signal at an output signal rise time;
   providing a variable fall time control input;
   providing a variable rise time control input;
   providing a Fall Time Programmable Control Source (FTPCS) for programming a variable FTPCS signal to said buffer circuit as a function of said fall time control input;
   providing a Rise Time Programmable Control Source (RTPCS) for programming a variable RTPCS signal to said buffer circuit as a function of said rise time control input;
   said buffer circuit providing said buffer output signal with a fall time delay between said input signal fall time and said output signal fall time as a function of said variable FTPCS signal; and
   said buffer circuit providing said buffer output signal with a rise time delay between said input signal rise time and said output signal rise time as a function of said variable RTPCS signal.

2. The method of claim 1 wherein said buffer circuit includes a first inverter and a second inverter.

3. The method of claim 1 including:
   providing said buffer circuit with a first inverter and a second inverter;
   providing for said first inverter to have an input for receiving said buffer input signal via an intermediate node;
   providing for second inverter output to generate said buffer output signal in response to an input to a second inverter input;
   providing for said first inverter to have a first inverter output connected to said second inverter input;
   providing for said first inverter to respond to said FTPCS when said input signal transits from logic high to logic low to initiate said fall time delay;
   providing for said first inverter to respond to said RTPCS when said input signal transits from logic low to logic high to initiate said rise time delay;
   generating triggering of said second inverter to initiate said falling buffer output signal at the end of said fall time delay and to initiate said rising buffer output signal at the end of a rise time delay.

4. The method of claim 3 including connecting a capacitor between said node and a reference potential.

5. The method of claim 3 including:
   connecting a capacitor between said node and a reference potential; and
   providing a Schmitt trigger circuit as said second inverter.

6. The method of claim 3 including providing for said buffer circuit to respond as follows:
   a. to an output current from said FTPCS when said input signal transits from logic high to logic low; and
   b. to respond an output current through said RTPCS when said input signal transits from logic low to logic high.

7. The method of claim 3 including:
   providing a first control word to a first latch which in turn provides a first variable control signal to said FTPCS; and
   providing a second control word to a second latch which in turn provides a second variable control signal to said RTPCS.

8. The method of claim 7 including:
   providing FET fingers in said FTPCS with each finger thereof being controlled by an output from a register in said first latch; and
   providing FET fingers in said second RTPCS with each finger thereof being controlled by an output from a register in a corresponding latch.

9. The method of claim 3 including:
   providing current mirror circuits in said FTPCS and said RTPCS;
   providing a first control word to a first latch which in turn provides a first variable control signal to said first FTPCS;
   providing a second control word to a second latch which in turn provides a second variable control signal to said RTPCS; and
   providing FET fingers in said FTPCS with each finger thereof being controlled by an output from a register in said first latch; and providing FET fingers in said RTPCS with each finger thereof being controlled by an output from a register in a corresponding latch.

10. The method of claim 9 including connecting a capacitor between said node and a reference potential.

11. The method of claim 9 including:

connecting a capacitor between said node and a reference potential; and providing a Schmitt trigger circuit as said second inverter.

12. The method of claim 8 including providing current mirror circuits in said FTPCS and said RTPCS.

13. The method of claim 9 including:

providing a first control word to a first latch which in turn provides a first variable control signal to said FTPCS; and providing a second control word to a second latch which in turn provides a second variable control signal to said RTPCS.

14. The method of claim 6 including:

providing FET fingers in said FTPCS with each finger thereof being controlled by an output from a register in said first latch; and providing FET fingers in said RTPCS with each finger thereof being controlled by an output from a register in a corresponding latch.

15. A method of providing dual edge programming in a programmable delay unit comprising:

providing a buffer control circuit with a signal input, a signal output, a PSPC connection line, and a NSPC connection line;

providing an P Side Programmable Current (PSPC) source having a PSPC input and a PSPC current line connected to said buffer through said PSPC connection line;

providing an N side (NS) latch adapted to receive an input of an N side control word and an N side write signal and outputs of N side switching signals; which are a function of said N side control word;

said NS latch providing outputs of N side switching signals which are a function of said N side control word, with outputs of said N side switching signals being provided to said input of said PSPC source;

providing an N Side Programmable Current (NSPC) source having an NSPC source input and an NSPC current line connected to said buffer through said NSPC connection line;

providing a P side (PS) latch adapted to receive an input of a P side control word and a P side write signal and outputs of P side switching signals, which are a function of said P side control word; and said PS latch providing outputs of P side switching signals which are a function of said P side control word with said outputs of said N side switching signals being provided to said input of said PSPC source.

16. The method of claim 15 wherein said buffer control circuit includes a first inverter and a second inverter.

17. The method of claim 15 including:

providing said buffer control circuit with a first inverter and a second inverter each having an input and an output with said first inverter having a first inverter input and a first output and said second inverter having a second input and a second output;

providing for said first inverter to respond to said first PSPC source when said input signal transits from logic high to logic low to connect between said first PSPC source and said first output;

providing for said first inverter to respond to said second PSPC source when said input signal transits from logic low to logic high to connect between said second PSPC source and said first output;

connecting said first output of said first inverter to a node connected to said second input of said second inverter; and said second inverter providing said output signal at said second output, from said second inverter.

18. The method of claim 15 including:

providing a PMOS FET and an NMOS FET in said first inverter having first ends of source drain circuits thereof connected to said output of said first inverter;

connecting said input to said first inverter to gate electrodes of said PMOS FET and said NMOS FET.

19. The method of claim 18 including connecting opposite ends of said source drain circuits of said PMOS FET and said NMOS FET to outputs of said first PSPC source and said second PSPC source.

20. A dual edge programmable delay unit comprising:

a buffer circuit which is adapted to receive a buffer input signal, said buffer input signal falling at an input signal fall time and said buffer input signal rising at an input signal rise time;

said buffer circuit being adapted to provide a falling buffer output signal at an output signal fall time and a rising buffer output signal at an output signal rise time;

a variable fall time control input;

a variable rise time control input;

a Fall Time Programmable Control Source (FTPCS) for programming a variable FTPCS signal to said buffer circuit as a function of said fall time control input;

a Rise Time Programmable Control Source (RTPCS) for programming a variable RTPCS signal to said buffer circuit as a function of said rise time control input;

said buffer circuit providing said buffer output signal with a fall time delay between said input signal fall time and said output signal fall time as a function of said variable FTPCS signal; and said buffer circuit providing said buffer output signal with a rise time delay between said input signal rise time and said output signal rise time as a function of said variable RTPCS signal.

* * * * *